United States Patent
Koukitu et al.

(10) Patent No.: US 7,621,999 B2
(45) Date of Patent: Nov. 24, 2009

(54) METHOD AND APPARATUS FOR ALGAN VAPOR PHASE GROWTH

(75) Inventors: Akinori Koukitu, Fucyu (JP); Yoshinao Kumagai, Fucyu (JP)

(73) Assignee: Tokyo University of Agriculture and Technology TLO Co., Ltd, Tokyo (JP)

(*) Notice: Subject to any disclaimer, the term of this patent is extended or adjusted under 35 U.S.C. 154(b) by 232 days.

(21) Appl. No.: 11/661,234

(22) PCT Filed: Aug. 26, 2005

(86) PCT No.: PCT/JP2005/015529

§ 371 (c)(1),
(2), (4) Date: Feb. 26, 2007

(87) PCT Pub. No.: WO2006/030617

PCT Pub. Date: Mar. 23, 2006

(65) Prior Publication Data

US 2008/0063584 A1    Mar. 13, 2008

(30) Foreign Application Priority Data

Aug. 31, 2004   (JP) ............................. 2004-251810

(51) Int. Cl.
*C30B 21/02* (2006.01)
(52) U.S. Cl. .................. 117/84; 117/94; 117/95; 117/104
(58) Field of Classification Search ............ 117/84, 117/94, 95, 104
See application file for complete search history.

(56) References Cited

U.S. PATENT DOCUMENTS

| | | | |
|---|---|---|---|
| 6,495,894 B2 | 12/2002 | Shibata et al. | |
| 6,875,273 B2 | 4/2005 | Katamine et al. | |
| 2002/0177312 A1 | 11/2002 | Tsvetkov et al. | |
| 2007/0032046 A1* | 2/2007 | Dmitriev et al. | ............ 438/478 |

FOREIGN PATENT DOCUMENTS

| | | |
|---|---|---|
| CN | 1344037 A | 4/2002 |
| CN | 1387233 A | 12/2002 |
| JP | A 10-215000 | 8/1998 |
| JP | A 10-316498 | 12/1998 |
| JP | A 2000-223418 | 8/2000 |
| JP | A 2003-158344 | 5/2003 |
| JP | A 2003-303774 | 10/2003 |

OTHER PUBLICATIONS

U.S. Appl. No. 10/509,177, filed Sep. 27, 2004, Akinori Koukitsu et al.

* cited by examiner

*Primary Examiner*—Robert M Kunemund
(74) *Attorney, Agent, or Firm*—Oliff & Berridge, PLC

(57) ABSTRACT

An epitaxial growing method in which a crystal of $Al_xGa_{1-x}N$ wherein x is a desirable constituent ratio can be grown on an Si substrate or sapphire substrate according to the HVPE process. Crystal of $Al_xGa_{1-x}N$ is grown according to the HVPE process in which use is made of an aluminum material, a gallium material, an ammonia material and a carrier gas. The carrier gas consists of an inert gas and hydrogen, and the partial pressure of hydrogen is set so as to range from 0 to <0.1. As a result, the relationship between feeding ratio among materials and constituent ratio of grown crystal can be made linear, thereby enhancing the controllability of crystal composition.

6 Claims, 3 Drawing Sheets

METHOD AND APPARATUS FOR ALGAN VAPOR PHASE GROWTH

TECHNICAL FIELD

The present invention relates to epitaxial growth method and apparatus for AlGaN utilized in an ultraviolet laser, LED, and a high-frequency high-power electronic device.

BACKGROUND ART

Usually an HB (Horizontal Bridgiman) method and an LEC (Liquid Encapsulated Czochralski) method are well known as a method of producing a bulk crystal. However, an AlGaN single crystal is hardly grown by these methods.

Therefore, recently an attempt of the bulk crystal growth is made by a sublimation method and solution growth at high temperature and high-pressure. However, the AlGaN crystal which can be used for large-size substrate crystal is not obtained yet even by such methods.

Currently, hetero-epitaxial growth of AlGaN on a substrate (for example, sapphire substrate) by an HVPE (Hydride Vapor Phase Epitaxy) method is one of the most promising methods of producing the AlGaN single-crystal substrate. In the method, an Al source gas, a Ga source gas, and an $NH_3$ source gas are mixed in a mixing portion, and the mixed gas is transported to a growth portion (also called substrate portion because the substrate is located). Then, AlGaN is grown on the sapphire substrate accommodated in the growth portion.

HVPE Method

Particularly a high growth rate is one of advantages in the HVPE method which is of a quartz reaction tube hot-wall method. Therefore, conventionally the HVPE method is used to produce a high sensitive photo-sensor in which a thick film is required and a power device (particularly, power-supply device in which GaAs is used) in which a thick-film, high-quality crystal is required, and HVPE method is also utilized as a method of producing the substrate, particularly a GaN substrate.

For example, Patent Document 1 "Gallium nitride based compound semiconductor crystal growth method (TOYODA GOSEI CO., LTD et al.)" and Patent Document 2 "Epitaxial wafer and production method thereof (Sumitomo Electric Industries, Ltd)" disclose that the HVPE method is utilized for the method of producing the GaN substrate.

The inventor developed a technique of producing a substrate made of a III-V compound including Al by HVPE (method), and the inventor made another patent application (Japanese Patent Application No. 2002-106102) (Patent Document 3).

Patent Document 1: Japanese Patent Laid-Open No. 10-215000

Patent Document 2: Japanese Patent Laid-Open No. 10-316498

Patent Document 3: Japanese Patent Laid-Open No. 2003-303774

DISCLOSURE OF THE INVENTION

Problems to be Solved by the Invention

The inventors study the AlGaN crystal growth by the HVPE method.

Consequently, the inventors find a problem that controllability of a composition ratio becomes worsened when AlGaN "thick-film" crystal is grown by the HVPE method.

The problem will be described below.

AlGaN

Because AlGaN is a so-called mixed crystal (sometimes called solid solution) of AlN and GaN, AlGaN is frequently described as $Al_xGa_{1-x}N$ to clearly specify a ratio thereof. Where x is a ratio of AlN in the crystal, and x can range from 0 or more to 1 or less. Atomic level bonding is established in $Al_xGa_{1-x}N$ for all the values ranging from 0 to 1, and so-called solid solution is formed. In the case of x=0, because the composition ratio of AlN is zero, AlGaN is GaN. In the case of x=1, AlGaN is AlN. It is necessary to correctly determine the value of x according to application of AlGaN.

However, in the case where the AlGaN thick film is produced by the HVPE method, because conventionally there is not known an effective technique of setting the value of x which is of the composition ratio of Al at a desired value, the crystal growth is experimentally performed by changing conditions in various ways.

In view of the foregoing, an object of the invention is to provide an epitaxial growth method in which the high-quality AlGaN crystal can be grown on the sapphire substrate or the Si substrate by the HVPE method. Another object of the invention is to realize a method and an apparatus, in which the value of x of $Al_xGa_{1-x}N$ can be set at the desired value.

Means for Solving Problem

As a result of the earnest study, the inventors find that the control of the value of x becomes difficult in the case when the linear relationship does not hold between the source gas ratio and the value of x of the grown $Al_xGa_{1-x}N$.

Then, as a result of the further study, the inventors find the condition that the linear relationship holds between the source gas ratio and the value of x of the grown $Al_xGa_{1-x}N$, and the inventors develop the following crystal growth method and apparatus in which the value of x of the grown $Al_xGa_{1-x}N$ can easily be controlled by growing the $Al_xGa_{1-x}N$ crystal under such conditions.

A. Invention of $Al_xGa_{1-x}N$ Vapor Phase Growth Method (1) A first aspect according to the invention provides a method in which a substrate crystal is arranged in a mixed gas and an AlGaN crystal is grown on the substrate. The substrate crystal, an aluminum source gas, a gallium source gas, a nitrogen source gas, and a carrier gas being mixed in the mixed gas, and the AlGaN crystal vapor phase growth method is characterized in that a hydrogen partial pressure in the carrier gas is set to 0 atm.

The above configuration can establish the further linear relationship between the material supply ratio and the composition of the obtained crystal, which facilitates the control of the crystal composition.

(2) A second aspect according to the invention provides a method in which a substrate crystal is arranged in a mixed gas and an AlGaN crystal is grown on the substrate crystal, an aluminum material, a gallium material, a nitrogen material, and a carrier gas being mixed in the mixed gas, and the AlGaN crystal vapor phase growth method is characterized in that a hydrogen partial pressure in the carrier gas is set to 0 atm or more to less than 0.01 atm.

The above configuration can establish the further linear relationship between the material supply ratio and the composition of the obtained crystal while the hydrogen partial pressure in the carrier gas is kept at a certain degree of value, which facilitates the control of the crystal composition.

(3) A third aspect according to the invention provides a method in which a substrate crystal is arranged in a mixed gas and an AlGaN crystal is grown on the substrate crystal, an aluminum material, a gallium material, a nitrogen material, and a carrier gas being mixed in the mixed gas, and the AlGaN crystal vapor phase growth method is characterized in that a hydrogen partial pressure in the carrier gas is set to 0 atm or more to less than 0.1 atm.

The above configuration can establish the further linear relationship between the material supply ratio and the composition of the obtained crystal while the hydrogen partial pressure in the carrier gas is kept at a certain degree of value, which facilitates the control of the crystal composition.

(4) A fourth aspect according the invention provides a method in which an AlGaN crystal vapor phase growth method according to the first to third aspect of the invention, preferably a composition ratio of Al and Ga in the AlGaN crystal is adjusted by changing a ratio of an aluminum material and a gallium material.

The above configuration enables the composition ratio of the AlGaN crystal to be controlled.

B. Invention of $Al_xGa_{1-x}N$ Obtained by $Al_xGa_{1-x}N$ Vapor Phase Growth Method (5) A fifth aspect according to the invention provides a thick-film substrate made of an AlGaN crystal, which is produced by the AlGaN crystal vapor phase growth method according to the first to fourth aspects of the invention.

According to the above methods, the thick-film substrate can be produced because the crystal composition can easily be controlled.

C. Invention of $Al_xGa_{1-x}N$ Vapor Phase Growth Apparatus (6) A sixth aspect according to the invention provides an apparatus which grows an AlGaN crystal on a substrate crystal arranged in a growth portion, the apparatus including the growth portion in which the substrate crystal is arranged; aluminum material supply means for supplying an aluminum material with a carrier gas to the growth portion; gallium material supply means for supplying a gallium material with the carrier gas to the growth portion; and nitrogen material supply means for supplying a nitrogen material with the carrier gas to the growth portion, and the AlGaN crystal vapor phase growth apparatus is characterized in that the carrier gas in which a hydrogen partial pressure is 0 atm is used in the aluminum material supply means, the gallium material supply means, and the nitrogen material supply means.

The above configuration can establish the further linear relationship between the material supply ratio and the composition of the obtained crystal. As a result, according to the apparatus, the control of the crystal composition becomes easy.

(7) A seventh aspect according to the invention provides an apparatus which grows an AlGaN crystal on a substrate crystal arranged in a growth portion, the apparatus including the growth portion in which the substrate crystal is arranged; aluminum material supply means for supplying an aluminum material with a carrier gas to the growth portion; gallium material supply means for supplying a gallium material with the carrier gas to the growth portion; and nitrogen material supply means for supplying a nitrogen material with the carrier gas to the growth portion, and the AlGaN crystal vapor phase growth apparatus is characterized in that the carrier gas in which a hydrogen partial pressure is 0 atm or more to less than 0.01 atm is used in the aluminum material supply means, the gallium material supply means, and the nitrogen material supply means.

The above configuration can establish the further linear relationship between the material supply ratio and the composition of the obtained crystal while the hydrogen partial pressure in the carrier gas is kept at a certain degree of value. As a result, according to the apparatus, the control of the crystal composition becomes easy.

(8) An eighth aspect according to the invention provides an apparatus which grows an AlGaN crystal on a substrate crystal arranged in a growth portion, the apparatus including the growth portion in which the substrate crystal is arranged; aluminum material supply means for supplying an aluminum material with a carrier gas to the growth portion; gallium material supply means for supplying a gallium material with the carrier gas to the growth portion; and nitrogen material supply means for supplying a nitrogen material with the carrier gas to the growth portion, and the AlGaN crystal vapor phase growth apparatus is characterized in that the carrier gas in which a hydrogen partial pressure is 0 atm or more to less than 0.1 atm is used in the aluminum material supply means, the gallium material supply means, and the nitrogen material supply means.

The above configuration can establish the further linear relationship between the material supply ratio and the composition of the obtained crystal while the hydrogen partial pressure in the carrier gas is kept at a certain degree of value. As a result, according to the apparatus, the control of the crystal composition becomes easy.

D. Invention of $Al_xGa_{1-x}N$ Obtained by $Al_xGa_{1-x}N$ Vapor Phase Growth Apparatus (9) A ninth aspect according to the invention provides a thick-film substrate made of an AlGaN crystal, which is produced by the AlGaN crystal vapor phase growth apparatus according to the sixth to eighth aspects of the invention.

According to each apparatus described above, the thick-film substrate can be produced because the crystal composition can easily be controlled.

EFFECT OF THE INVENTION

Thus, according to the invention, in growing the $Al_xGa_{1-x}N$ crystal, the Al composition ratio (x) in the $Al_xGa_{1-x}N$ crystal is easily set to the desired value. As a result, compared with the conventional technique, the AlGaN crystal having the desired composition ratio can easily be obtained, and the thick-film substrate can be produced.

Figure 1:
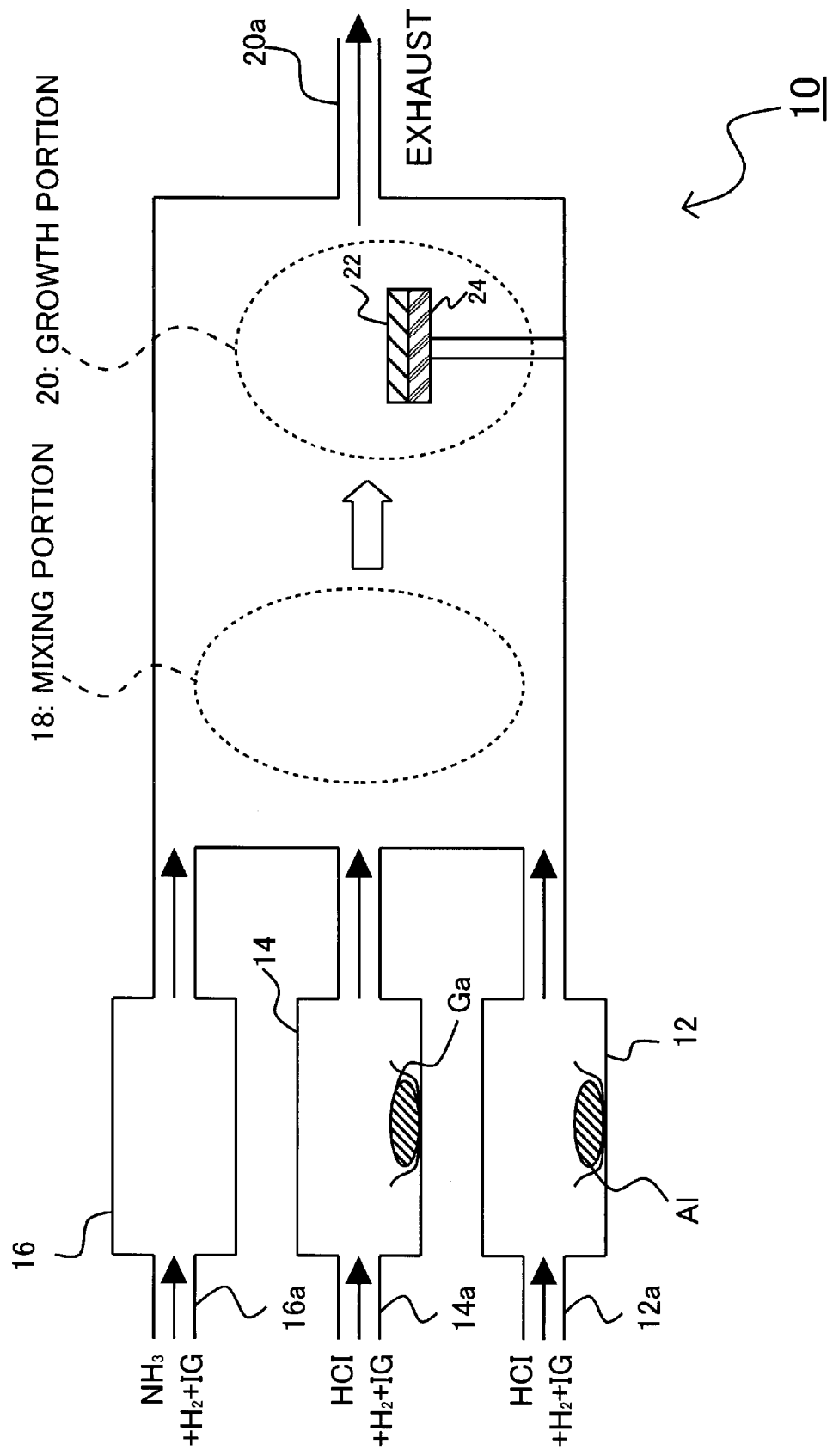
FIG. 1 is a schematic view showing a vapor phase growth apparatus according to an embodiment.

EXPLANATIONS OF LETTERS OR NUMERALS 10 vapor phase growth apparatus
12 aluminum material supply portion
12a first gas introduction passage
14 gallium material supply portion
14a second gas introduction passage
16 nitrogen material supply portion
16a third gas introduction passage
18 mixing portion 20 growth portion
20a exhaust port
22 substrate crystal
24 carbon susceptor

BEST MODE FOR CARRYING OUT THE INVENTION

An AlGaN epitaxial layer growth method according to a preferred embodiment of the invention will be described below in detail with reference to the drawings.

Configuration of Vapor Phase Growth Apparatus

FIG. 1 is a schematic view showing a vapor phase growth apparatus 10 used in the embodiment. The vapor phase growth apparatus 10 for the HVPE (Hydride Vapor Phase Epitaxy) method, used in the embodiment, will be described with reference to FIG. 1.

As shown in FIG. 1, the vapor phase growth apparatus 10 includes an aluminum material supply portion 12 which supplies an aluminum material, a gallium material supply portion 14 which supplies a gallium material, and a nitrogen material supply portion 16 which supplies a nitrogen material. The gases supplied from the supply portions are mixed in a mixing portion 18, and the mixed gas is used for the crystal growth in a growth portion 20. The growth portion 20 is formed by a quartz reaction chamber, and the growth portion 20 includes an exhaust port 20a.

Aluminum Material Supply Portion

As shown in FIG. 1, the aluminum material supply portion 12 is a predetermined reaction chamber in which metallic aluminum is accommodated. A first gas introduction passage 12a is provided in the aluminum material supply portion 12. HCl, a hydrogen gas $H_2$, and a (inert) carrier gas (IG) are introduced through the first gas introduction passage 12a. The metallic aluminum reacts with these gases to generate $AlCl_3$ which is of the aluminum material source for AlGaN (growth). A reaction formula for producing $AlCl_3$ is expressed as follows.

$$Al + 3HCl \rightarrow AlCl_3 + 3/2 H_2 \quad \text{[Chemical formula 1]}$$

$AlCl_3$ obtained by the chemical formula 1 is transported to the mixing portion 18 along with the carrier gas.

The feature of the embodiment is that a hydrogen partial pressure in the carrier gas used is within a predetermined range. Setting the hydrogen partial pressure at a value within the predetermined range facilitates setting a value of x which is of a composition of finally-produced $Al_xGa_{1-x}N$ at a desired value. The specific value of the hydrogen partial pressure will be described later.

The aluminum material supply portion 12 is kept at a predetermined temperature using a heater (not shown). Specifically, it is preferable that the aluminum material supply portion 12 be kept at a temperature range (750° C. or less) in which $AlCl_3$ is generated rather than another substance (AlCl) by the reaction between Al metal and HCl. In the embodiment, the aluminum material supply portion 12 is kept at the temperature of 500° C.

Although the $AlCl_3$ is produced as described above in the embodiment, $AlCl_3$ powders may be sublimated and transported to the mixing portion 18.

Gallium Material Supply Portion

As shown in FIG. 1, the gallium material supply portion 14 is a predetermined reaction chamber in which metallic gallium is accommodated. A second gas introduction passage 14a is provided in the gallium material supply portion 14. HCl, the hydrogen gas $H_2$, and the (inert) carrier gas (IG) are introduced through the second gas introduction passage 14a. The metallic gallium reacts with these gases to generate GaCl which is of the gallium material for AlGaN (growth). A reaction formula for producing GaCl is expressed as follows.

$$Ga + HCl \rightarrow GaCl + 1/2 H_2 \quad \text{[Chemical Formula 2]}$$

GaCl obtained by the chemical formula 2 is transported to the mixing portion 18 along with the carrier gas.

The feature of the embodiment is that the hydrogen partial pressure in the carrier gas used is within a predetermined range. Setting the hydrogen partial pressure at a value within the predetermined range facilitates setting a value of x which is of a composition of finally-produced $Al_xGa_{1-x}N$ at a desired value. The specific value of the hydrogen partial pressure will be described later.

Nitrogen Material Supply Portion

The nitrogen material supply portion 16 is a predetermined reaction chamber as shown in FIG. 1. A third gas introduction passage 16a is provided in the nitrogen material supply portion 16. The hydrogen gas $H_2$, the (inert) carrier gas (IG), and ammonia $NH_3$ are introduced through the third gas introduction passage 16a.

Although not shown, a heater is provided around the nitrogen material supply portion 16 to heat the nitrogen material supply portion 16 at a predetermined temperature. The ammonia $NH_3$ is decomposed at a predetermined ratio in the nitrogen material supply portion 16 by the heat generated by the heater. The mixed gas of the ammonia $NH_3$ decomposed at the predetermined ratio, the hydrogen gas $H_2$, and the (inert) carrier gas (IG) are transported to the mixing portion 18. Similarly, in the nitrogen material supply portion 16, setting a hydrogen partial pressure in the carrier gas ($F^0$) at a value within the predetermined range facilitates setting a value of x which is of a composition ratio of Al at a desired value.

Mixing Portion

The source gases supplied from the aluminum material supply portion 12, the gallium material supply portion 14, and the nitrogen material supply portion 16 are mixed together in the mixing portion 18. A heater (not shown) is provided in the mixing portion 18 to keep the mixing portion 18 at a predetermined temperature.

Growth Portion

A substrate crystal 22 on which the ($Al_xGa_{1-x}N$) crystal is grown is accommodated in the growth portion 20. A predetermined heater (not shown) is provided to keep the growth portion 20 at a temperature suitable for the crystal growth. Various known configurations can be adopted in such heaters. For example, a heater with heating wire and a high-frequency (induction) heater can be used.

In the embodiment, the high-frequency (induction) heater is used to heat the substrate crystal 22 in a concentrated manner. Preferably optical heating is used to heat the substrate crystal 22 in a concentrated manner. These heaters are well known.

In the embodiment, a sapphire substrate is used as the substrate crystal 22. The substrate crystal 22 is placed on a carbon susceptor 24.

Crystal Growth

The above configuration can grow a solid solution of $Al_xGa_{1-x}N$ (0<=x<=1) which is of a mixed crystal of AlN and GaN on the substrate crystal 22.

Adjustment of Composition Ratio

A device to facilitate setting the value of x in $Al_xGa_{1-x}N$ is made in the embodiment. Qualitatively, a ratio of the aluminum material to the gallium material is increased to increase the value of x, and the ratio of the aluminum material to the gallium material is decreased to decrease the value of x.

However, because generally a linear relationship does not hold between "material ratio" and the value of x, sometimes adjustment is hardly made.

The feature of the embodiment is that the linear relationship between "material ratio" and the value of x is established as much as possible by setting the hydrogen partial pressure in the carrier gas at a value with in the desired range. As a result, according to the embodiment, the linear relationship can be established as much as possible between the change in material ratio and the change in value of x, which facilitates the adjustment of the value of x.

As described above, the aluminum material supply portion 12 is kept at the temperature of 500° C., which allows the generation of AlCl to be suppressed to generate the large amount of $AlCl_3$. As a result, there is no risk of quartz corrosion even if the reaction chamber is made of the quartz.

The gallium material supply portion 14 is kept at the temperature of 700° C. using the heater (not shown). The nitrogen material supply portion 16 is also kept at a predetermined temperature using the heater (not shown). The nitrogen material supply portion 16 may be set at the same temperature as the aluminum material supply portion 12, or nitrogen material supply portion 16 may be set at a different temperature.

Preferably the mixing portion 18 is kept at a temperature in which the $AlCl_3$ generated in the aluminum material supply portion 12 is not deposited in the quartz chamber and at a temperature range in which AlN and GaN are not deposited in the mixing portion 18. This is because the materials can be transported to the growth portion 20 without depositing the material in mid-flow by keeping the mixing portion 18 at the above temperature range. In the embodiment, specifically the mixing portion is kept at the temperature range of 160° C. or more to 750° C. or less. The heater (not shown) is provided around the mixing portion 18 to keep the mixing portion 18 at the above temperature range.

The substrate crystal is set at a predetermined temperature in the temperature range of 900° C. to 1600° C. In the embodiment, the substrate crystal in the growth portion 20 is kept at the temperature of 1000° C.

Heating the substrate crystal 22 in the collective manner prevents the deposition of AlN or GaN before the AlN or GaN reaches the substrate crystal 22, and the crystal can efficiently be grown on the substrate crystal 22.

Although the high-frequency (induction) heating is adopted in the embodiment, another heating method (such as optical heating and resistance heating) may be adopted in place of the high-frequency (induction) heating. In the case of the resistance heating, a resistance wire is provided sufficiently near the substrate crystal 22, which allows the gas not to be heated too much while the substrate crystal 22 is mainly heated. In the case of the optical heating, it is also preferable to adopt a configuration in which a surface of the substrate crystal 22 is irradiated with light from the outside of the quartz reaction chamber. According to the above configuration, the temperature of the substrate crystal 22 can mainly be raised without substantially raising the temperatures of the translucent quartz and the ambient gases. The furnace with the light irradiation is known, and the furnace with a light source such as a halogen lamp and a xenon lamp is already brought into practical use. Another support material may be used in place of the carbon susceptor 24.

In addition to the sapphire substrate, a Si crystal can also be used as the substrate crystal 22.

Particularly, in the case where the sapphire substrate is used, for example, preferably the sapphire substrate is placed on a thin carbon plate and the sapphire substrate is heated by irradiating the sapphire substrate with the light from the carbon plate side. The thin carbon plate is placed in the backside of the sapphire substrate, and the sapphire substrate can be heated through the thin carbon plate by irradiating the sapphire substrate with the light from the carbon plate. As a result, only the temperature of the sapphire substrate can easily be raised without substantially raising the temperatures of the ambient gas and the reaction area.

After the $Al_xGa_{1-x}N$ crystal layer is grown in the above-described manner, the thick AlGaN substrate can be obtained by removing the sapphire substrate or the Si substrate which is used as the initial substrate.

Carrier Gas

The gas in which a predetermined amount of $H_2$ is mixed in an inert gas such as $N_2$, He and Ar is used as the carrier gas in the embodiment.

The feature in the embodiment is that the further linear relationship between the ratio of aluminum material and gallium material and the ratio of aluminum and gallium in the generated crystal can be established by setting a $H_2$ concentration in the carrier gas at the later-mentioned range. As a result, compared with the conventional technique, it is easy that the material ratio in the generated crystal is set at the desired ratio.

That is, it is easier that the value of "x" in $Al_xGa_{1-x}N$ is set at the desired value.

The inventors grew the $Al_xGa_{1-x}N$ thick-film crystal on the substrate crystal 22 (sapphire substrate) by performing the crystal growth of $Al_xGa_{1-x}N$ for one to ten hours at the above temperature range, and the inventors performed experiments to measure the composition of the obtained $Al_xGa_{1-x}N$ crystal.

Figure 2:
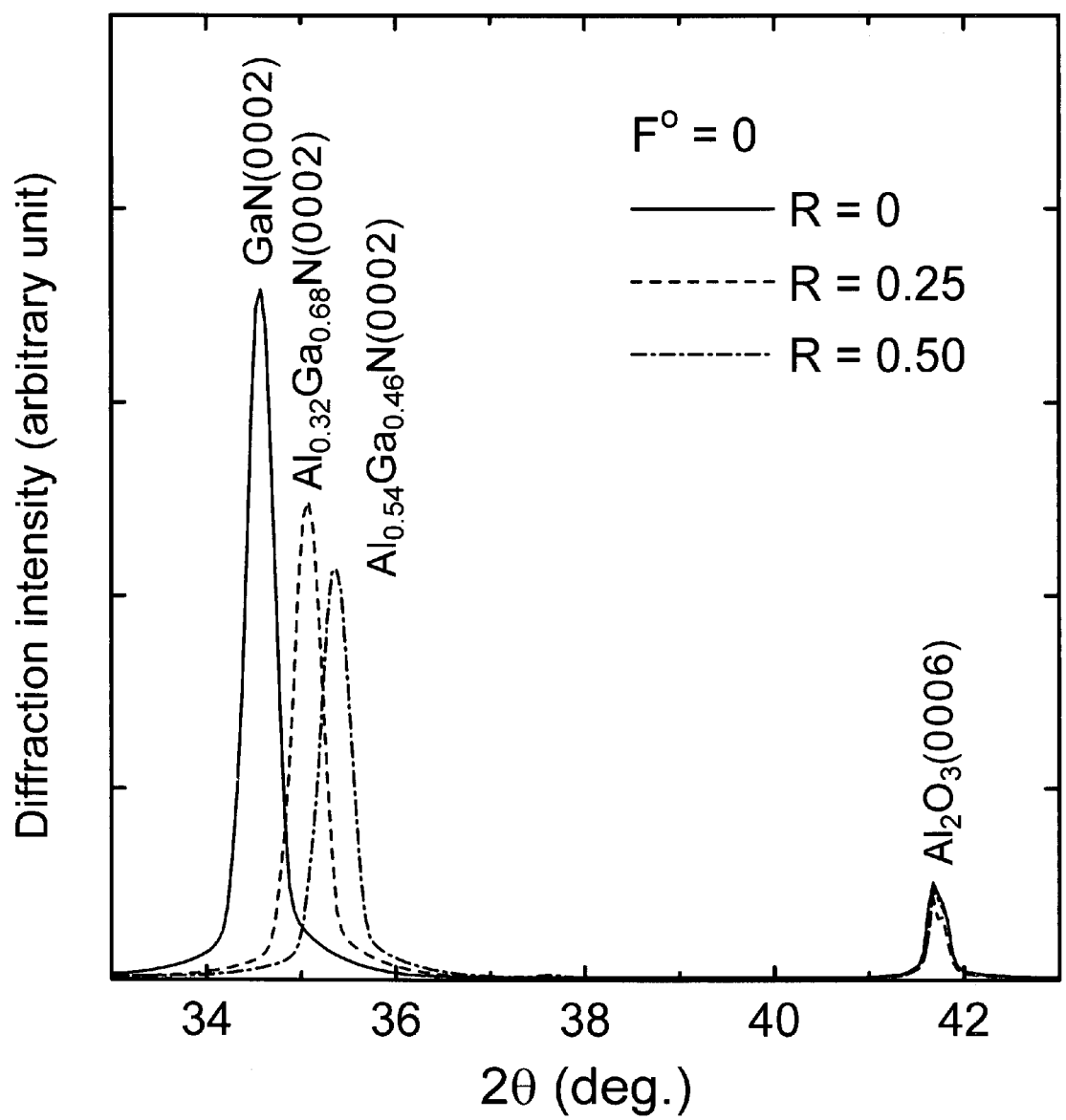
FIG. 2 is a X-ray diffraction pattern of a growth layer obtained when an $Al_xGa_{1-x}N$ crystal is grown while a vapor phase supply ratio R is changed in the case of a hydrogen partial pressure in the carrier gas, $F^0=0$.
Figure 3:
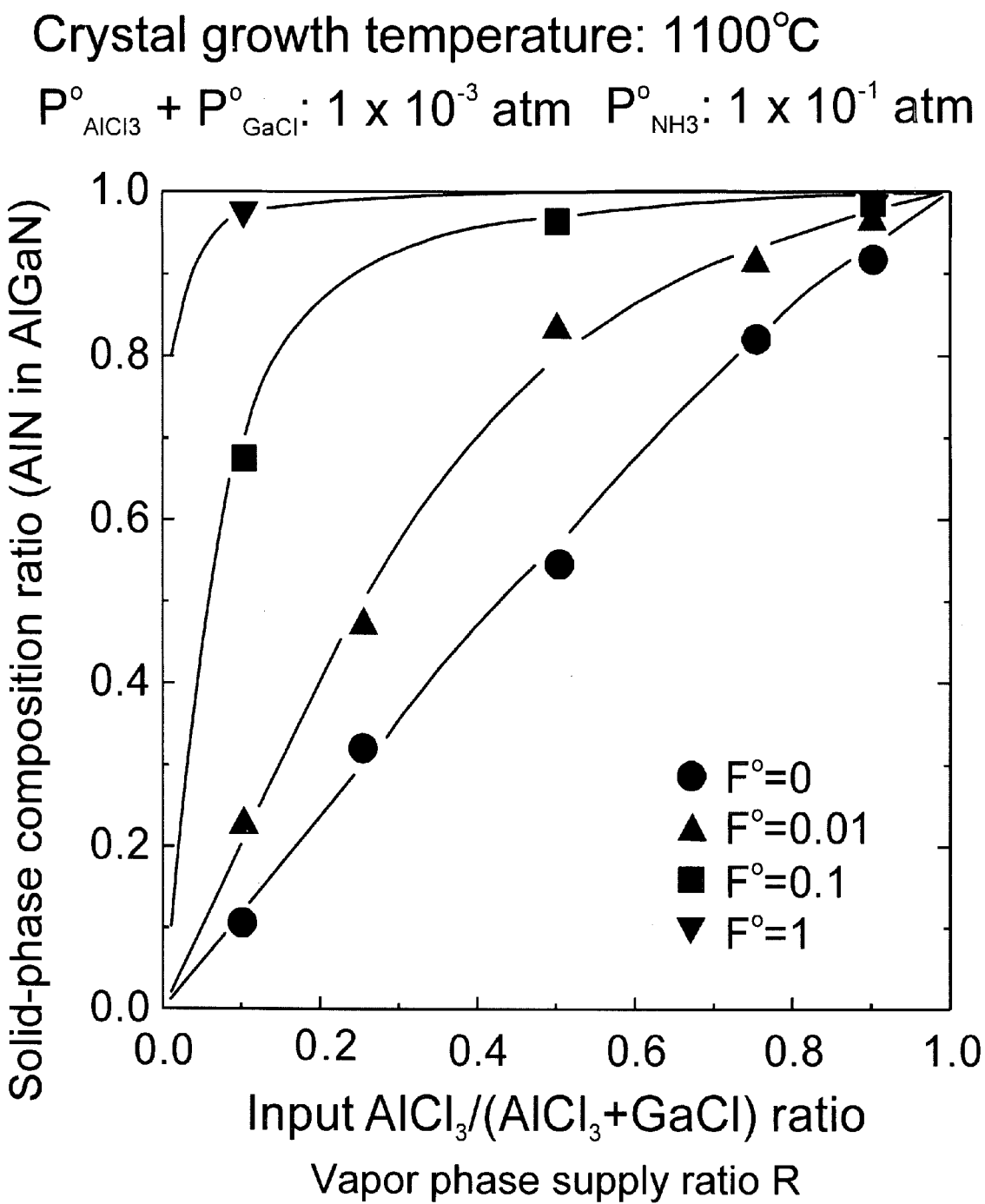
FIG. 3 is a graph showing a relationship between the vapor phase supply ratio R and a composition of a grown crystal in the case where hydrogen partial pressure in the gas carrier gas $F^0$ is 0, 0.01, 0.1, and 1.

The experiments were performed while
ratio of source gases ($AlCl_3$ and $GaCl$ gases), and
hydrogen partial pressure in carrier gas are changed respectively. FIGS. 2 and 3 are graphs showing the experimental results.

Graph of FIG. 2 (in the case of hydrogen partial pressure $F^0=0$)

FIG. 2 is the graph showing an X-ray diffraction pattern of the obtained $Al_xGa_{1-x}N$ crystal in the case of hydrogen partial pressure $F^0=0$. In the case of hydrogen partial pressure $F^0=0$, a value of a vapor phase supply ratio R ($[AlCl_3]/\{[AlCl_3]+[GaCl]\}$) is changed to grow the $Al_xGa_{1-x}N$ crystal, and the obtained $Al_xGa_{1-x}N$ crystal is checked with XRD (X-ray diffraction analysis apparatus). In the graph of FIG. 2, a vertical axis indicates (diffraction) intensity (arbitrary unit) and a horizontal axis indicates an angle (2θ (degree.)).

In the graph of FIG. 2, the carrier gas is formed only by the inert gas because of the hydrogen partial pressure $F^0=0$. The $Al_xGa_{1-x}N$ crystal is grown at three kinds of the vapor phase supply ratios R under the condition of $F^0=0$ (inert carrier gas).

When the vapor phase supply ratio R is zero, it means that the aluminum source gas is absent. From the diffraction pattern (solid line in the graph) of the obtained crystal, it is found that the crystal is formed only by GaN.

When the vapor phase supply ratio R is 0.25, it means that the aluminum material ratio is 0.25. From a peak position in the diffraction pattern (dashed line in the graph) of the obtained crystal, it is found that the crystal is the mixed crystal having the composition of $Al_{0.32}Ga_{0.68}N$.

When the vapor phase supply ratio R is 0.50, it means that the aluminum material ratio is 0.5. From a peak position in the diffraction pattern (alternate long and short dash line in the graph) of the obtained crystal, it is found that the crystal is the mixed crystal having the composition of $Al_{0.54}Ga_{0.46}N$.

Thus, as the vapor phase supply ratio R is increased, the peak is shifted toward the high angle side, and the solid-phase composition ratio x of AlN is increased.

Graph of FIG. 3 (in the case of hydrogen partial pressure $F^0=0$, 0.01, 0.1, and 1)

The graph of FIG. 3 shows the relationship between the vapor phase supply ratio R and the composition of the grown crystal (specifically, x which is of the solid-phase composition ratio of aluminum) in the case of the hydrogen partial pressure $F^0=0$, 0.01, 0.1, and 1 in the carrier gas. In the graph of FIG. 3, the vertical axis indicates the solid-phase composition ratio x and the horizontal axis indicates the vapor phase supply ratio R.

In FIG. 3, the solid line is a theoretically-computed value. Plots, ●, ▲, ■, and ▼ are measured values obtained by the experiments.

In the case of $F^0=0$, the graph is expressed by the solid line passing through the plots ●, and it is understood that the substantially linear relationship holds between the vapor phase supply ratio R and the solid-phase composition ratio x of aluminum.

In the case of $F^0=0.01$, the graph is expressed by the solid line passing through the plots ▲, and the substantially linear relationship holds between the vapor phase supply ratio R and the solid-phase composition ratio x of aluminum while the nonlinearity is slightly exhibited.

In the case of the small absolute value of the vapor phase supply ratio R, the solid-phase composition ratio x is relatively largely changed as the vapor phase supply ratio R is changed. On the other hand, in the case of the large absolute value of the vapor phase supply ratio R, the change in solid-phase composition ratio x becomes relatively small even if the vapor phase supply ratio R is changed, and the nonlinearity is exhibited.

In the case of $F^0=0.1$, the nonlinearity becomes slightly significant. In the case of $F^0=0.1$, the graph is expressed by the solid line passing through the plots ■, and it is understood from the graph expressed by the plots ■ that the relationship between the vapor phase supply ratio R and the solid-phase composition ratio x of aluminum becomes the graph which is bent at the value R of about 0.2. Thus, in the case of $F^0=0.1$, because the nonlinearity becomes significant, it is difficult that the solid-phase composition ratio x is controlled by adjusting the vapor phase supply ratio R.

In the case of $F^0=1$, the graph exhibits the remarkable nonlinearity. In FIG. 3, the graph is expressed by the solid line passing through the plots ▼ in the case of $F^0=1$. In the case of $F^0=1$, it is understood from the graph expressed by the plots ▼ that the relationship between the vapor phase supply ratio R and the solid-phase composition ratio x of aluminum becomes the graph which is steeply bent at the value R of about 0.05. Thus, in the case of $F^0=1$, because the nonlinearity becomes further significant, it is difficult that the solid phase composition ratio x is controlled by adjusting the vapor phase supply ratio R. Particularly, it is extremely difficult that the solid-phase composition ratio x is adjusted at a predetermined value between 0.0 and 0.8.

Hydrogen Partial Pressure

In consideration of the above results, from the standpoint of the controllability of the crystal composition ratio, it is desirable that the hydrogen partial pressure be zero.

However, in the case where the hydrogen partial pressure is completely zero, sometimes an adverse effect is exhibited by impurities. In consideration of general accuracy of the apparatus, quality of the material, and the like, in many cases, it is preferable that the hydrogen partial pressure be held in the range of 0 or more to less than 0.01.

Depending on a fluctuation of apparatus performance and the quality of the material, sometimes it is preferable that the hydrogen partial pressure be in the range of 0 or more to less than 0.1.

SUMMARY

As described above, in the embodiment, the further linear relationship can be established between the vapor phase supply ratio R and the solid-phase composition ratio x of the generated crystal by setting the value $F^0$ of the hydrogen partial pressure in the carrier gas to the predetermined range. As a result, according to the embodiment, the solid phase composition ratio x of the grown crystal can more easily be set at the desired value compared with the conventional technique.

The invention claimed is:

1. An AlGaN crystal vapor phase growth method, wherein a substrate crystal is arranged in a mixed gas and the AlGaN crystal is grown on the substrate crystal, an aluminum material, a gallium material, a nitrogen material, and a carrier gas being mixed in the mixed gas, and wherein a hydrogen partial pressure in the carrier gas is greater than 0 atm and lower than 0.01 atm.

2. An AlGaN crystal vapor phase growth method, wherein a substrate crystal is arranged in a mixed gas and the AlGaN crystal is grown on the substrate crystal, an aluminum material, a gallium material, a nitrogen material, and a carrier gas being mixed in the mixed gas, and wherein a hydrogen partial pressure in the carrier gas is greater than 0 atm and lower than 0.1 atm.

3. The AlGaN crystal vapor phase growth method as in claim 1, wherein a composition ratio of Al and Ga in the AlGaN crystal is adjusted by changing a ratio of an aluminum material and a gallium material.

4. An apparatus which grows an AlGaN crystal on a substrate crystal arranged in a growth portion, the apparatus comprising:
   the growth portion in which the substrate crystal is arranged;
   aluminum material supply means for supplying an aluminum material with a carrier gas to the growth portion;
   gallium material supply means for supplying a gallium material with the carrier gas to the growth portion;
   nitrogen material supply means for supplying a nitrogen material with the carrier gas to the growth portion, and
   control means in the aluminum material supply means, the gallium material supply means, and the nitrogen material supply means, respectively, configured to control the carrier gases such that a hydrogen partial pressure in each of the carrier gases is greater than 0 atm and lower than 0.01 atm.

5. An apparatus which grows an AlGaN crystal on a substrate crystal arranged in a growth portion, the apparatus comprising:
   the growth portion in which the substrate crystal is arranged;
   aluminum material supply means for supplying an aluminum material with a carrier gas to the growth portion;
   gallium material supply means for supplying a gallium material with the carrier gas to the growth portion; and
   nitrogen material supply means for supplying a nitrogen material with the carrier gas to the growth portion,
   control means in the aluminum material supply means, the gallium material supply means, and the nitrogen material supply means, respectively, configured to control the carrier gases such that a hydrogen partial pressure in each of the carrier gases is greater than 0 atm and lower than 0.1 atm.

6. The AlGaN crystal vapor phase growth method as in claim 2, wherein a composition ratio of Al and Ga in the AlGaN crystal is adjusted by changing a ratio of an aluminum material and a gallium material.

* * * * *